United States Patent
Chan (12)

(10) Patent No.: US 6,288,453 B1
(45) Date of Patent: Sep. 11, 2001

(54) ALIGNMENT OF OPENINGS IN SEMICONDUCTOR FABRICATION

(75) Inventor: Victer Chan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/395,062

(22) Filed: Sep. 13, 1999

Related U.S. Application Data

(62) Division of application No. 09/054,279, filed on Apr. 2, 1998, now Pat. No. 5,998,226.

(51) Int. Cl.$^7$ .................................................. H01L 23/544
(52) U.S. Cl. ......................... 257/797; 438/401; 438/462; 438/975
(58) Field of Search ............................ 257/797; 438/401, 438/462, 975

(56) References Cited

U.S. PATENT DOCUMENTS

| | | | | |
|---|---|---|---|---|
| 3,808,527 | * | 4/1974 | Thomas | 148/DIG. 102 |
| 4,386,459 | * | 6/1983 | Boulin | 324/158.1 |
| 5,861,679 | * | 1/1999 | Nagano | 257/786 |
| 5,898,228 | * | 4/1999 | Sugasawara | 257/797 |
| 6,072,192 | * | 6/2000 | Fulford, Jr. et al. | 257/48 |

* cited by examiner

Primary Examiner—Eddie Lee
Assistant Examiner—Allan R. Wilson

(57) ABSTRACT

A single multifunctional structure can be used to determine the alignment accuracy of the contact layer and the interconnect layer by inline visual inspection and by determination of the end of line electrical resistance properties.

10 Claims, 1 Drawing Sheet

ALIGNMENT OF OPENINGS IN SEMICONDUCTOR FABRICATION

This is a division of application Ser. No. 09/054,279 filed Apr. 2, 1998, now U.S. Pat. No. 5,998,226.

BACKGROUND OF THE INVENTION

This invention relates to methods for processing semiconductor materials, and in particular to methods for measuring the amount of alignment offset problems in the fabrication of a semiconductor which exist between an interconnect layer and a layer having openings therein such as vias or the like, and provides for effective and efficient electrical and visual alignment confirmation of the location of the openings.

Semiconductor integrated circuits undergo a variety of processing steps during manufacture, such as masking, resist coat, etching, and deposition. In many of these steps, material is overlaid or removed from the existing layer at specific locations in order to form the desired elements of the integrated circuit. Proper alignment of the various process layers is therefore critical. The shrinking dimensions of modem integrated circuits require increasingly stringent overlay alignment accuracy. If the proper alignment tolerance is not achieved, a device can result which is defective or has reliability problems.

More specifically, semiconductor processes such as described above employ fabrication steps in which aligned openings are formed in contact layers to complete an electrical connection. The interconnect layer is typically a metal layer and the contact layer or via layer is typically an insulating/dielectric layer.

There is thus a need that exists for reducing alignment offset problems between an interconnect layer and the layer containing the openings.

SUMMARY OF THE INVENTION

The above-described needs have been met by the system and method of the present invention which enables the effective and efficient determination of the above-described misalignment between the via and interconnect layers. In this way, defective semiconductors produced in semiconductor wafer fabrication can be readily identified and segregated for shipment to customers.

A single multifunctional structure formed in the interconnect layer can be used to determine the alignment accuracy of contact at via inline visual inspection and end of line electrical examination of the resistance properties of the semiconductor wafer.

Preferably, the unitary multifunctional alignment structure is an integral continuous structural member having a stairstep design for use in maximizing the overlay capabilities with respect to the openings by the unitary multifunctional alignment structure. Furthermore, the integral continuous structural member can include an alignment indicator section comprising a series of individual rectangular stairstep sections which are joined together and offset with respect to each other. The size and relative offset location of the individual rectangular stairstep sections is preferably an inline visual alignment standard for checking the size and relative position of the openings against the design rule of the semiconductor wafer. In one form of this invention, the step of electrically measuring the amount of misalignment of the openings with respect to the multifunctional alignment structure is conducted at the conclusion of the semiconductor wafer formation process.

The present invention can further include the steps of connecting the first interconnect layer to a first bond pad, connecting the second interconnect layer to a second bond pad, and thereby forming an electrical connection between first and second interconnect layers through each of the openings, respectively. Next, an electrical voltage is applied between first and second interconnect layers through each of the openings, respectively. The current between the first and second interconnect layers through each of the openings is measured. In this way, the resistance between the first and second interconnect layers and each of the openings can be calculated, and the alignment accuracy of each of the semiconductor wafers being tested can be electrically measuring based on difference in the resistance between the first and second interconnect layers through each of the openings.

Such a multifunctional alignment structure comprises means for visually comparing the relative position of the openings inline with respect to the multifunctional alignment structure to determine the degree of offset of the openings with the design rule of the semiconductor wafer, and means for electrically measuring the amount of misalignment of the openings with respect to the multifunctional alignment structure to determine the degree of offset of the openings with the design rule of the semiconductor wafer.

The unitary multifunctional alignment structure preferably comprises an integral continuous structural member including an alignment indicator section comprising a series of individual rectangular stairstep sections which are joined together and offset with respect to each other, the size and relative offset location of individual rectangular stairstep sections is an inline visual alignment standard for checking the size and relative position of the openings against the design rule of the semiconductor wafer.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
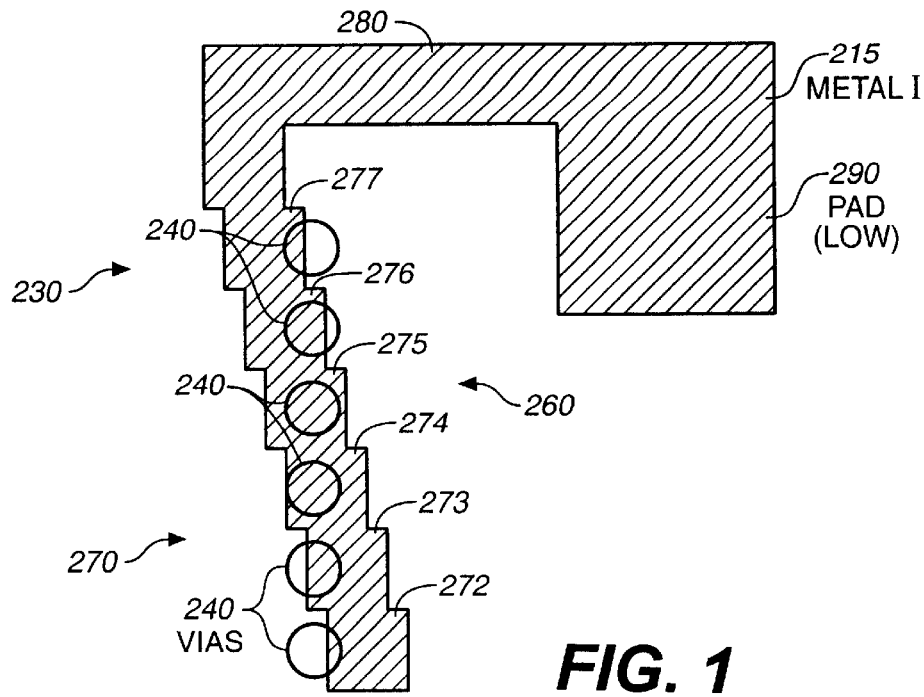
FIG. 1 is a schematic representation of a preferred multifunctional unitary design structure capable for use in the inline visual determination of the degree of offset of the openings with the design rule of the semiconductor wafer.
Figure 2:
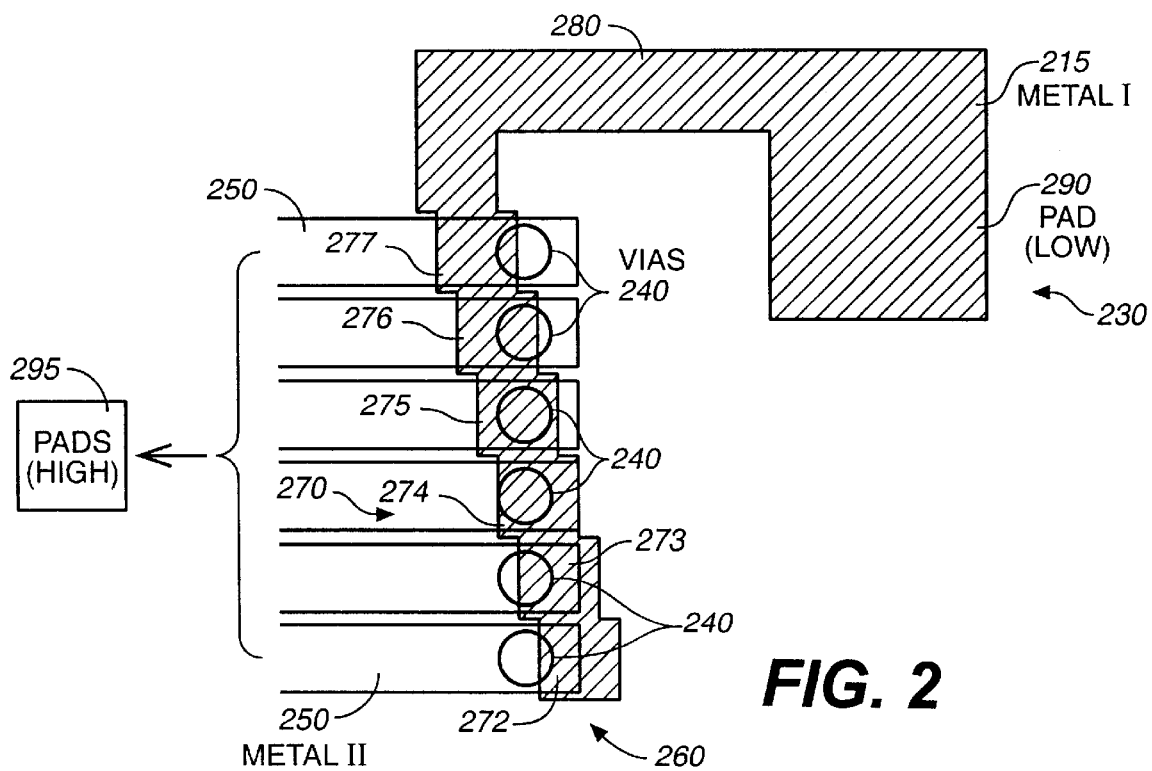
FIG. 2 is a schematic representation of a preferred multifunctional unitary design structure capable for use in the electrical measurable determination of the degree of offset of the openings with the design rule of the semiconductor wafer.

Referring to FIGS. 1 & 2, structure 230 for use in performing the dual inline visual function (FIG. 1) and the electrical measurement alignment function (FIG. 2) is designed with multiple vias 240 overlapping the metal layers 215 & 250. The integral continuous structural member 230, preferably having a stairstep design generally designed "260", is employed for use in maximizing the overlay capabilities with respect to the vias 240 by the structural configuration 230. Structure 230 comprises an alignment indicator section generally "270" comprising a series of individual rectangular stairstep sections 272–277 which are joined together and offset with respect to each other. Alignment indicator section 276 is attached to a bond pad 290 by a connector member 28. The size and relative offset location of individual rectangular stairstep sections 272–277 comprises an inline visual alignment standard for checking the size and relative position of the vias 240 against the design rule of the semiconductor wafer 200. Stated another way, the structure 230 can be used to indicate the alignment accuracy. Alignment is very important to the functionality of the semiconductor circuits as a whole.

The structure 230 can be electrically measured at the end of wafer fabrication process to determine the amount of misalignment. In this way, a single structure can be employed to measure alignment offset by, in addition to conducting inline visual inspection, determining the end of the line electrical properties. For example, multiple mini contact pads 290 and 295 in the subject design are used to electrically measure and establish the correlation between the resistance and the amount of misalignment. As shown in FIG. 1, contact pad 290 is attached to connector member 280. Contact pads 295 are attached to the second metal layer 250. The resistance between these contact pads is readily measurable to determine alignment compliance of a give semiconductor wafer 200.

Visual inspection of the alignment of the vias 240 and the structural pattern 230 is conducted to ensure alignment between the layer 215 and the vias 240. Thus, one can readily inspect the inline visual structure to determine the above-described alignment.

An electrical connection between the interconnect layers 215 and 250, and the vias 240, is completed. Then, an electrical voltage is applied via contact pads 290 and 295 between layers 215 and 250, and a current is measured for a given resistance calculation. This measurement is repeated for each of the vias 240 with respect to the layers 215 and 250 of the stairstep structure. The difference in resistance can then be calculated to determine the accuracy of the via to metal alignment properties of each via 240.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A semiconductor wafer comprising:

a silicon wafer substrate;

a first contact layer formed on an outer surface of said silicon wafer substrate;

a first interconnect layer formed on an outer surface of said contact layer;

a unitary multifunctional alignment structure formed in said first interconnect layer for use in both inline visually aligning and electrically measuring the alignment accuracy of said semiconductor wafer;

a second contact layer formed on an outer surface of said first interconnect layer;

a plurality of openings formed in a predetermined pattern in said second contact layer, the openings and the unitary multifunctional alignment structure having a spatial relationship such that all of the openings at least partially overlie and progressively offset the unitary multifunctional alignment structure in instances of proper alignment between the openings and the unitary multifunctional alignment structure in a manner that allows visual confirmation of instances of proper alignment, and further that at least some of the openings do not overlie the unitary multifunctional alignment structure in instances of improper alignment between the openings and the unitary multifunctional alignment structure in a manner that allows visual confirmation of instances of misalignment between the openings and the unitary multifunctional alignment structure; and a second interconnect layer formed on an outer surface of said second contact layer, the second interconnect layer having electrically conductive traces, one of each of the electrically conductive traces associated with one of each of the openings in the contact layer, whereby all of the electrically conductive traces make electrical contact with the multifunctional alignment structure through the openings in instances of proper alignment between the openings and the unitary multifunctional alignment structure in a manner that allows electrical confirmation of instances of proper alignment, and further that at least some of the electrically conductive traces do not make electrical contact with the multifunctional alignment structure through the openings in instances of improper alignment between the openings and the unitary multifunctional alignment structure in a manner that allows electrical confirmation of instances of improper alignment.

2. The semiconductor wafer of claim 1, wherein at least one of the first and the second interconnect layers is a metallic layer.

3. The semiconductor wafer of claim 1, wherein the unitary multifunctional alignment structure is an integral continuous structural member having a stairstep design for use in maximizing the overlay capabilities with respect to the openings by the unitary multi-functional alignment structure.

4. A semiconductor wafer comprising:

a silicon wafer substrate;

a first contact layer formed on an outer surface of said silicon wafer substrate;

a first interconnect layer formed on an outer surface of said contact layer;

a unitary multifunctional alignment structure formed in said first interconnect layer for use in both inline visually aligning and electrically measuring the alignment accuracy of each of said semiconductor wafers, wherein the unitary multifunctional alignment structure is an integral continuous structural member having a stairstep design for use in maximizing overlay capabilities with respect to the openings by the unitary multi-functional alignment structure, wherein the integral continuous structural member includes an alignment indicator section comprising a series of individual rectangular stairstep sections which are joined together and offset with respect to each other, the size and relative offset location of individual rectangular stairstep sections is an inline visual alignment standard for checking the size and relative position of the openings against a design rule of the semiconductor wafer;

a second contact layer formed on an outer surface of said first interconnect layer;

a plurality of openings formed in a predetermined pattern in said second contact layer; and a second interconnect layer formed on an outer surface of said second contact layer;

said semiconductor wafer being capable of (a) visually comparing the relative position of the openings inline with respect to the multifunctional alignment structure to determine a degree of offset of the openings with the design rule of the semiconductor wafer, and (b) electrically measuring and amount of misalignment of the openings with respect to the multifunctional alignment structure to determine the degree of offset of the openings with the design rule of the semiconductor wafer.

5. The semiconductor wafer of claim 1, wherein the first interconnect layer is connected to a first bond pad, the second interconnect layer is connected to a second bond pad and thereby forming an electrical connection between said first and second interconnect layers through each of said openings, respectively, so that when an electrical voltage is applied between the first and second interconnect layers through each of said openings, respectively, and the current is measured between the first and second interconnect layers through each of said openings, the resistance between the first and second interconnect layers through each of said openings can be calculated, and the alignment accuracy of the semiconductor wafer being tested can be determined based on difference in the resistance between the first and second interconnect layers through each of said openings.

6. A unitary multifunctional alignment structure formed in a semiconductor device for determining both inline and end of line alignment accuracy between openings in a contact layer and at least one underlying interconnect layer of said semiconductor device, by inline visual and end of line electrical confirmation of alignment accuracy of said semiconductor device, wherein the unitary multifunctional alignment structure is an integral continuous structural member having a stairstep design for use in maximizing overlay capabilities with respect to the openings by the unitary multifunctional alignment structure, the unitary multifunctional alignment structure comprising;

means for visually comparing the relative position of the openings inline with respect to the multifunctional alignment structure to determine a degree of offset of the openings with a design rule of the semiconductor wafer, means for electrically measuring an amount of misalignment of the openings with respect to the multifunctional alignment structure to determine the degree of offset of the openings with the design rule of the semiconductor wafer, and an alignment indicator section comprising a series of individual rectangular stairstep sections which are joined together and offset with respect to each other, the size and relative offset location of individual rectangular stairstep sections is an inline visual alignment standard for checking the size and relative position of the openings against the design rule of the semiconductor wafer.

7. An alignment indicator for visually and electrically confirming proper alignment between features of a first electrically conductive interconnect layer and a predetermined pattern of openings formed in an electrically nonconductive contact layer that overlies the first electrically conductive interconnect layer, the alignment indicator comprising rectangular sections formed in the first electrically conductive interconnect layer that are directly joined to each other in a stair step pattern having an offset between the rectangular sections, the rectangular sections of the first electrically conductive interconnect layer underlying the predetermined pattern of openings of the electrically nonconductive contact layer, and the offset between the rectangular sections of the first electrically conductive interconnect layer providing a visual alignment standard for checking proper alignment between the predetermined pattern of openings of the electrically nonconductive contact layer and the rectangular sections of the first electrically conductive interconnect layer.

8. A semiconductor device, the improvement comprising the alignment indicator of claim 7.

9. The alignment indicator of claim 7 further comprising a second electrically conductive interconnect layer overlying the electrically nonconductive contact layer, the second electrically conductive interconnect layer forming leads, where a different one of each of the leads is associated with and overlies a different one of each of the openings in the predetermined pattern of openings, the leads for forming a first series of electrical contact points and the joined rectangular sections for forming a second electrical contact point, whereby if electrical continuity is observed between all of the leads of the first series of electrical contact points and the second electrical contact point, then the predetermined pattern of openings is properly aligned with the rectangular sections of the first electrically conductive interconnect layer, and if electrical continuity is not observed between at least one of the leads of the first series of electrical contact points and the second electrical contact point, then the predetermined pattern of openings is misaligned with the rectangular sections of the first electrically conductive interconnect layer.

10. A semiconductor device, the improvement comprising the alignment indicator of claim 9.

\* \* \* \* \*